(12) United States Patent
Flammer, III et al.

(10) Patent No.: US 9,791,485 B2
(45) Date of Patent: Oct. 17, 2017

(54) DETERMINING ELECTRIC GRID TOPOLOGY VIA A ZERO CROSSING TECHNIQUE

(71) Applicant: SILVER SPRING NETWORKS, INC., Redwood City, CA (US)

(72) Inventors: George H. Flammer, III, Cupertino, CA (US); Charles P. Sum, Cupertino, CA (US)

(73) Assignee: SILVER SPRING NETWORKS, INC., San Jose, CA (US)

( * ) Notice: Subject to any disclaimer, the term of this patent is extended or adjusted under 35 U.S.C. 154(b) by 305 days.

(21) Appl. No.: 14/586,536

(22) Filed: Dec. 30, 2014

(65) Prior Publication Data

US 2015/0253367 A1    Sep. 10, 2015

Related U.S. Application Data

(60) Provisional application No. 61/950,425, filed on Mar. 10, 2014, provisional application No. 62/045,423, (Continued)

(51) Int. Cl.
*G08C 19/00* (2006.01)
*G06F 15/16* (2006.01)
(Continued)

(52) U.S. Cl.
CPC ............ *G01R 25/00* (2013.01); *G01R 21/00* (2013.01); *H02J 3/00* (2013.01); *H02J 3/24* (2013.01);
(Continued)

(58) Field of Classification Search
CPC ........ H02H 3/162; H02H 1/0015; H02H 3/33; H02H 3/335; H02H 3/08; H02H 7/20;
(Continued)

(56) References Cited

U.S. PATENT DOCUMENTS 872,711  A  * 12/1907  Nayar et al. ............ B43L 25/10
                                                  15/257.073
7,180,300 B2 *  2/2007  Premerlani .......... G01R 31/086
                                                       324/509
(Continued)

*Primary Examiner* — Jermele M Hollington
*Assistant Examiner* — Taqi Nasir
(74) *Attorney, Agent, or Firm* — Artegis Law Group, LLP

(57) ABSTRACT

A node within a wireless mesh network is configured to record a zero crossing of alternating current or alternating voltage drawn by a single-phase power consumer and a precise timestamp when the zero crossing occurred, thereby generating timestamped zero crossing data. The node receives similar zero crossing data from a neighboring node. The node then compares the timestamped zero crossing data with the received zero crossing data to determine whether the phase associated with the node is equivalent to, leads, or lags the phase associated with the neighboring node. The node then acquires a positive phase identification associated with the neighboring node. Based on the phase identification, and based on the phase difference between the two nodes, the node infers the phase associated with the single-phase power consumer. That phase indicates the specific power line within a three-phase power distribution network to which the single-phase power consumer is coupled.

25 Claims, 11 Drawing Sheets

Related U.S. Application Data filed on Sep. 3, 2014, provisional application No. 62/094,907, filed on Dec. 19, 2014.

(51) Int. Cl.

| | |
|---|---|
| *G01R 25/00* | (2006.01) |
| *H02J 3/00* | (2006.01) |
| *G01R 21/00* | (2006.01) |
| *H02J 3/24* | (2006.01) |
| *H04L 29/08* | (2006.01) |
| *H04L 12/24* | (2006.01) |
| *H04L 29/06* | (2006.01) |
| *H04L 12/26* | (2006.01) |
| *H02J 3/06* | (2006.01) |

(52) U.S. Cl.
CPC ...... *H04L 41/0803* (2013.01); *H04L 41/0896* (2013.01); *H04L 41/12* (2013.01); *H04L 43/0876* (2013.01); *H04L 43/0888* (2013.01); *H04L 67/125* (2013.01); *H04L 67/16* (2013.01); *H04L 69/28* (2013.01); *H02J 3/06* (2013.01); *H02J 2003/007* (2013.01); *H04L 43/04* (2013.01); *Y02E 60/76* (2013.01); *Y04S 40/22* (2013.01)

(58) Field of Classification Search
CPC ........ H02H 3/044; H02H 3/10; G01R 31/086; G01R 15/18; G01R 19/04; G01R 19/10; G01R 19/145; G01R 19/16547; G01R 21/06; G01R 23/02; G01R 25/005; G01R 27/02; G01R 31/001
USPC ....... 324/543, 540, 537, 528, 527, 512, 500, 324/555, 76.11, 76.77, 76.52, 617, 622, 324/86, 519, 509, 523, 531, 533, 541, 324/544; 361/42, 44, 47, 244, 78, 85; 702/61, 72, 79, 89, 106, 122; 327/116, 327/153, 276

See application file for complete search history.

(56) References Cited

U.S. PATENT DOCUMENTS

| | | | |
|---|---|---|---|
| 7,969,155 B2 * | 6/2011 | Varghai | H02H 3/081 324/521 |
| 9,519,019 B2 * | 12/2016 | Feenstra | G01R 31/08 |
| 2011/0157366 A1 * | 6/2011 | Padmanabh | H04N 7/15 348/159 |
| 2012/0290651 A1 * | 11/2012 | Westbrooke | H04Q 9/00 709/204 |
| 2014/0085105 A1 * | 3/2014 | Vaswani | G01D 4/02 340/870.11 |

* cited by examiner

DETERMINING ELECTRIC GRID TOPOLOGY VIA A ZERO CROSSING TECHNIQUE

CROSS-REFERENCE TO RELATED APPLICATIONS

This application claims the benefit of the following U.S. provisional patent applications titled, "Smart Grid Processing to Evaluate Grid Conditions," filed Mar. 10, 2014 and having Ser. No. 61/950,425, titled, "Distributed Smart Grid Processing," filed Sep. 3, 2014 and having Ser. No. 62/045,423 and entitled, "Distributed Smart Grid Processing," filed Dec. 19, 2014, and having Ser. No. 62/094,907. The subject matter of these related applications is hereby incorporated herein by reference.

BACKGROUND OF THE INVENTION

Field of the Invention

Embodiments of the present invention relate generally to electricity grid architecture, and, more specifically, to determining electric grid topology via a zero crossing technique.

Description of the Related Art

FIG. 1 illustrates a conventional three-phase power distribution network 100, according to the prior art. As shown, power distribution network 100 typically includes a power generator 110 coupled via power lines 120 to a three-phase power consumer 130.

Power generator 110 is usually some sort of power plant, such as a hydroelectric dam or a nuclear power station. Power generator 110 includes different coils 112, 114, and 116 that are configured to generate power having specific voltages, currents, and phases. Coil 112 generates power having a voltage $V_1$ and a current $I_1$, where that current alternates with phase A. Similarly, coil 114 generates power having a voltage $V_2$ and a current $I_2$, where that current alternates with phase B, and coil 116 generates power having a voltage $V_3$ and a current $I_3$, where that current alternates with phase C. Coils 112, 114, and 116 transmit power across power lines 120-1, 120-2, and 120-3, respectively, to three-phase power consumer 130.

Three-phase power consumer 130 may be an industrial facility that operates heavy machinery, such as large three-phase motors, heating elements, pumps, and so forth, or a commercial enterprise that requires three-phase power, such as a shopping mall or supermarket. Three-phase power consumer 130 includes loads 132, 134, and 136 that receive power across power lines 120-1, 120-2, and 120-3. Load 132 receives power from power lines 120-1 and 120-2 and is subject to current $I_{12}$. Similarly, load 134 receives power from power lines 120-2 and 120-3 and is subject to current $I_{23}$, and load 136 receives power from power lines 120-3 and 120-1 and is subject to current $I_{31}$.

Various single-phase power consumers are also coupled to power lines 120 and configured to draw power therefrom. As shown, single-phase power consumer 140 is coupled to power line 120-1 and configured to draw power therefrom, single-phase power consumers 142 and 144 are coupled to power line 120-2 and configured to draw power therefrom, and single-phase power consumers 146, 148, and 150 are coupled to power line 120-3 and configured to draw power therefrom. A single-phase power consumer may be a house, a housing subdivision, an apartment complex, and so forth. The particular power line 120 to which each power consumer is coupled is referred to herein as the "grid topology."

During operation, maintaining relatively consistent loading across power lines 120 is desirable for several reasons. First, balancing the loads across power lines 120 minimizes resistive losses within three-phase power consumer 130, thereby improving operating efficiency. Second, balanced loading may prevent a situation where one power line 120 is underloaded and another power line 120 is overloaded and therefore subject to failure. In view of these reasons, among others, the utility provider responsible for managing distribution network 100 may adjust the grid topology in order to equalize the loading across power lines 120. In doing so, the utility provider may migrate single-phase power consumers from one power line 120 to another power line, thereby altering the loading of those power lines.

In order to accurately adjust the grid topology, the utility provider must first positively identify which single-phase loads are coupled to which power lines 120. Typically, the utility provider dispatches servicemen to "walk the lines" and visually inspect the coupling between single-phase power consumers and power lines 120. Based on this visual inspection, the utility provider records the grid topology. Then, the utility provider migrates single-phase power consumers between power lines in an effort to equalize loading across those power lines.

The approach outlined above is problematic because visually inspecting power lines to determine grid topology is very time-consuming and costly. Moreover, the grid topology determined via this type of approach is oftentimes incorrect/inaccurate due to human error. Consequently, among other things, utility providers typically cannot effectively balance loads across the different power lines within the power distribution network 100, with a reasonable degree of accuracy, which limits the efficiency of three-phase power consumer 130 and increases the susceptibility of power lines 120 to failure.

As the foregoing illustrates, what is needed in the art is a more effective approach for determining the topologies of power distribution networks.

SUMMARY OF THE INVENTION

One embodiment of the present invention sets forth a computer-implemented method for determining a network topology associated with a power distribution network, including obtaining first data indicating that a first node within a mesh network identified a first event at a first time, obtaining second data indicating that a second node within the mesh network identified a second event at a second time, determining a time difference between the first time and the second time, determining that the first node is coupled to a first element in the power distribution network that consumes power having a first phase of power, determining a phase of power associated with a second element in the power distribution network to which the second node is coupled based on the first phase of power and the time difference, and generating a network topology for the power distribution network that indicates that a power line is coupled to the second element and transports power having the phase of power associated with the second element.

At least one advantage of the disclosed technique is that the utility provider is not required to visually inspect the entire three-phase power distribution network in order to determine the network topology. Accordingly, the costs and human error usually associated with conventional approaches to determining network topology can be reduced or avoided entirely.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
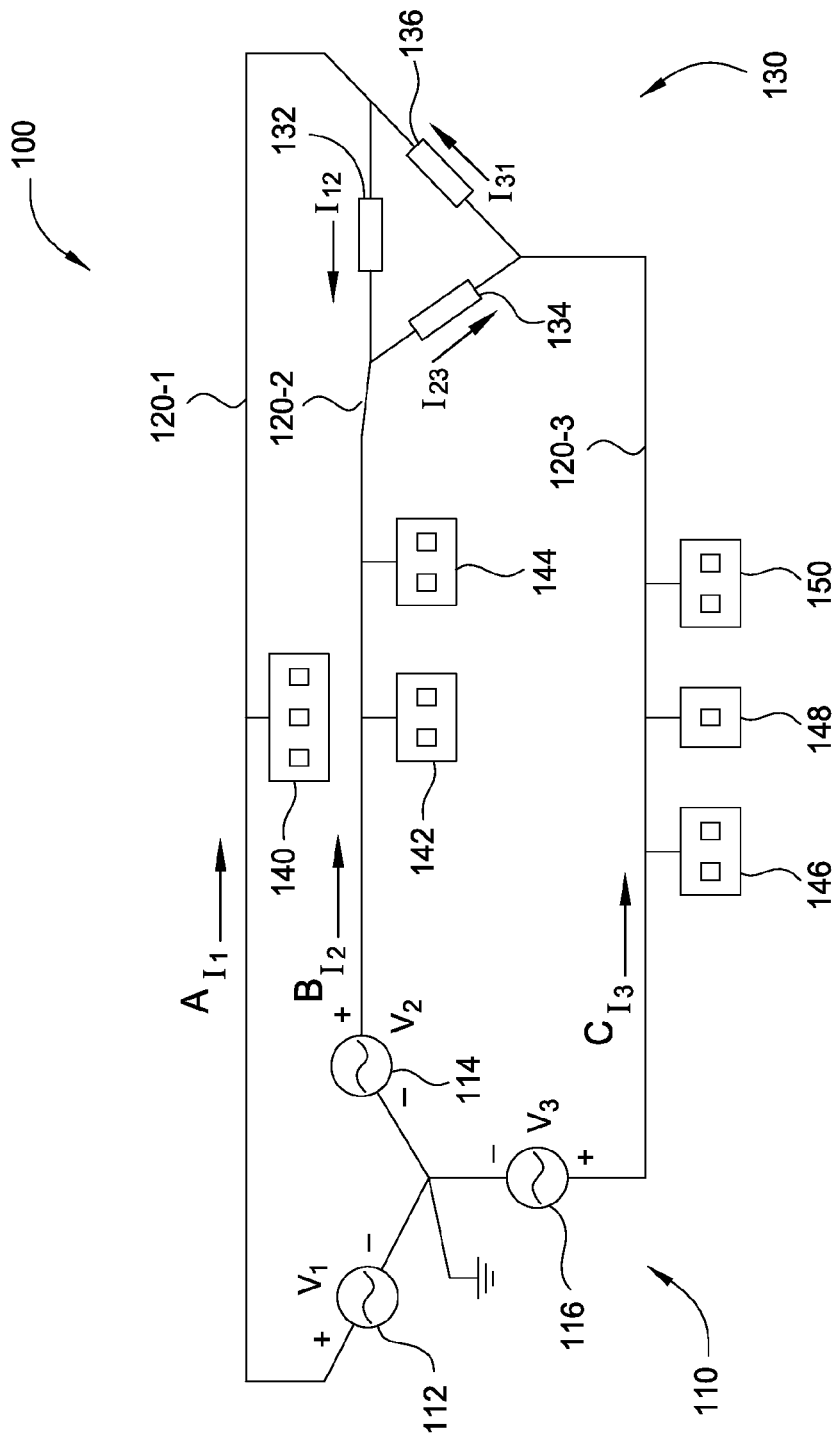
FIG. 1 illustrates a conventional three-phase power distribution network 100, according to the prior art.
Figure 2:
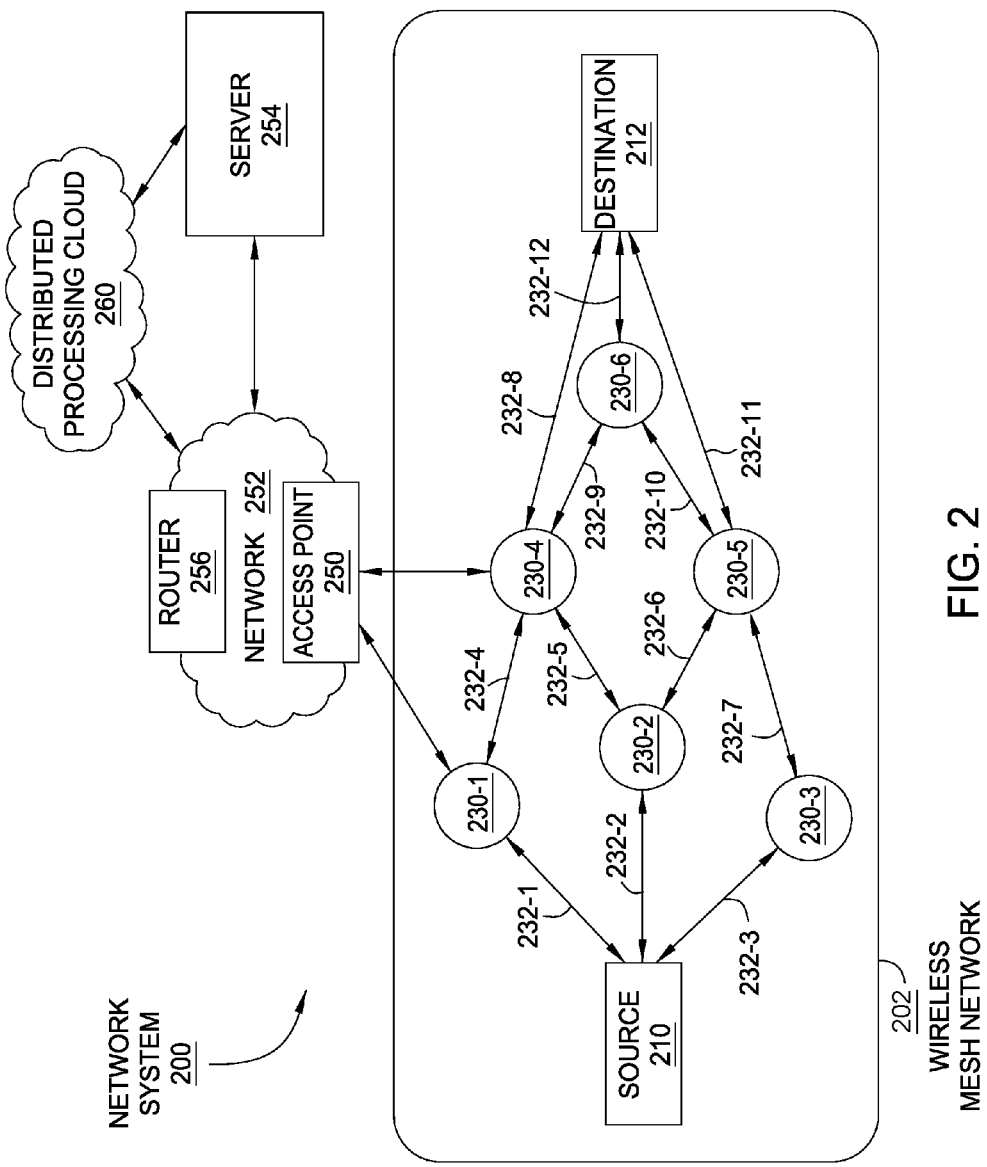
FIG. 2 illustrates a mesh network that operates in conjunction with the distribution network of FIG. 1, according to one embodiment of the present invention.

FIG. 2 illustrates a mesh network configured to operate in conjunction with power distribution network 100 of FIG. 1, according to one embodiment of the present invention. As shown, a network system 200 includes, without limitation, a wireless mesh network 202, which may include a source node 210, intermediate nodes 230 and destination node 212. Source node 210 is able to communicate with certain intermediate nodes 230 via communication links 232. Intermediate nodes 230 communicate amongst themselves via communication links 232. Intermediate nodes 230 communicate with destination node 212 via communication links 232. Network system 200 may also include an access point 250, a network 252, a server 254, and a router 256. Network 252 and server 254 may be coupled to a distributed processing cloud 260, which generally resides outside of network system 200. A given node 230 (or a source node 210 or a destination node 212) may reside within, or be coupled to, any of the elements of a power distribution network, including single-phase and three-phase power consumers, transformers, substations, and so forth.

A discovery protocol may be implemented to determine node adjacency to one or more adjacent nodes. For example, intermediate node 230-2 may execute the discovery protocol to determine that nodes 210, 230-4, and 230-5 are adjacent to node 230-2. Furthermore, this node adjacency indicates that communication links 232-2, 232-5, and 232-6 may be established with nodes 110, 230-4, and 230-5, respectively. Any technically feasible discovery protocol, including one related to IoT principles, may be implemented without departing from the scope and spirit of embodiments of the present invention.

The discovery protocol may also be implemented to determine the hopping sequences of adjacent nodes, i.e., the sequence of channels across which nodes periodically receive payload data. As is known in the art, a "channel" may correspond to a particular range of frequencies. Once adjacency is established between source node 210 and at least one intermediate node 230, source node 210 may generate payload data for delivery to destination node 212, assuming a path is available. The payload data may comprise an Internet protocol (IP) packet, an Ethernet frame, or any other technically feasible unit of data. Similarly, any technically feasible addressing and forwarding techniques may be implemented to facilitate delivery of the payload data from source node 210 to destination node 212. For example, the payload data may include a header field configured to include a destination address, such as an IP address or Ethernet media access control (MAC) address.

Each intermediate node 230 may be configured to forward the payload data based on the destination address. Alternatively, the payload data may include a header field configured to include at least one switch label to define a predetermined path from source node 210 to destination node 212. A forwarding database may be maintained by each intermediate node 230 that indicates which of communication links 232 should be used and in what priority to transmit the payload data for delivery to destination node 212. The forwarding database may represent multiple paths to the destination address, and each of the multiple paths may include one or more cost values. Any technically feasible type of cost value may characterize a link or a path within network system 200. In one embodiment, each node within wireless mesh network 202 implements substantially identical functionality and each node may act as a source node, destination node or intermediate node.

In network system 200, access point 250 is configured to communicate with at least one node within wireless mesh network 202, such as intermediate node 230-4. Communication may include transmission of payload data, timing data, or any other technically relevant data between access point 250 and the at least one node within wireless mesh network 202. For example, a communication link may be established between access point 250 and intermediate node 230-4 to facilitate transmission of payload data between wireless mesh network 202 and network 252. Network 252 is coupled to server 254 via a communications link. Access point 250 is coupled to network 252, which may comprise any wired, optical, wireless, or hybrid network configured to transmit payload data between access point 250 and server 254.

In one embodiment, server 254 represents a destination for payload data originating within wireless mesh network 202 and a source of payload data destined for one or more nodes within wireless mesh network 202. Server 254 generally resides within a "back office" type facility. Server 254 may also be implemented by a datacenter that includes a number of different computing devices networked together and coupled to a back office. In one embodiment, server 254 executes an application for interacting with nodes within wireless mesh network 202.

Nodes 230 within wireless mesh network 202 may perform measurements to generate data that reflects operating conditions of distribution network 100 of FIG. 1, including, e.g., power consumption data, among other measurements. In one embodiment, as described in greater detail below in conjunction with FIGS. 5-8, a given node 230 may be configured to determine the phase angle associated with power monitored by that node by detecting "zero crossings" of the alternating current or voltage associated with that power. The node 230 records data that reflects detected zero crossings, as well as the time when each such zero crossing occurred. The node 230 transmits this zero crossing data to server 254, and server 254 may then compare zero crossing data aggregated across all nodes to determine the precise phase angle associated with each node 230. Based on the determined phase angles, server 254 may then determine the topology of distribution network 100.

In another embodiment, as described in greater detail below in conjunction with FIGS. 9-10, server 254 may be configured to establish and maintain a "stream network" that operates above wireless mesh network 202. More specifically, as shown below in conjunction with FIG. 4, server 254 may be configured to implement "stream functions" across the nodes 230 within wireless mesh network 202. In such implementations, server 254 configures the different nodes 230 to execute one or more "stream functions" in order to process real-time data and generate data streams. Those data streams may reflect zero crossing data, phase data, and so forth. A stream function may be any technically feasible algorithm for processing and/or monitoring real-time data. A data stream represents real-time data that is generated by execution of a stream function. The stream network generally includes the various data streams and the paths through mesh network 202 followed by those data streams. A stream network configured to participate in determining network topology is described in greater detail below in conjunction with FIGS. 9-10.

Server 254 may be configured according to either one of, or both, of the aforementioned embodiments. As a general matter, server 254 may execute an application to collect, process, and report the aforementioned measurements recorded by each node 230, including the zero crossing data and corresponding timestamps mentioned above. In one embodiment, server 254 queries nodes 230 within wireless mesh network 202 for certain data. Each queried node replies with the requested data, such as consumption data, system status, health data, and so forth. In an alternative embodiment, each node within wireless mesh network 202 autonomously reports certain data, which is collected by server 254 as the data becomes available via autonomous reporting.

Server 254 may interact with distributed processing cloud 260 to perform some or all of the stream network configuration and stream function execution. Distributed processing cloud 260 may be a private or a public distributed processing cloud, or some combination thereof. Distributed processing cloud 260 may define a configurable data processing pipeline that affects a logical data network path above the physical node paths within mesh network 202.

The techniques described herein are sufficiently flexible to be utilized within any technically feasible network environment including, without limitation, a wide-area network (WAN) or a local-area network (LAN). Moreover, multiple network types may exist within a given network system 200. For example, communications between two nodes 230 or between a node 230 and the corresponding access point 250 may be via a radio-frequency local-area network (RF LAN), while communications between multiple access points 250 and the network may be via a WAN such as a general packet radio service (GPRS). As mentioned above, each node 230 within wireless mesh network 202 includes a network interface that enables the node to communicate wirelessly with other nodes. An exemplary network interface is described below in conjunction with FIG. 3.

Figure 3:
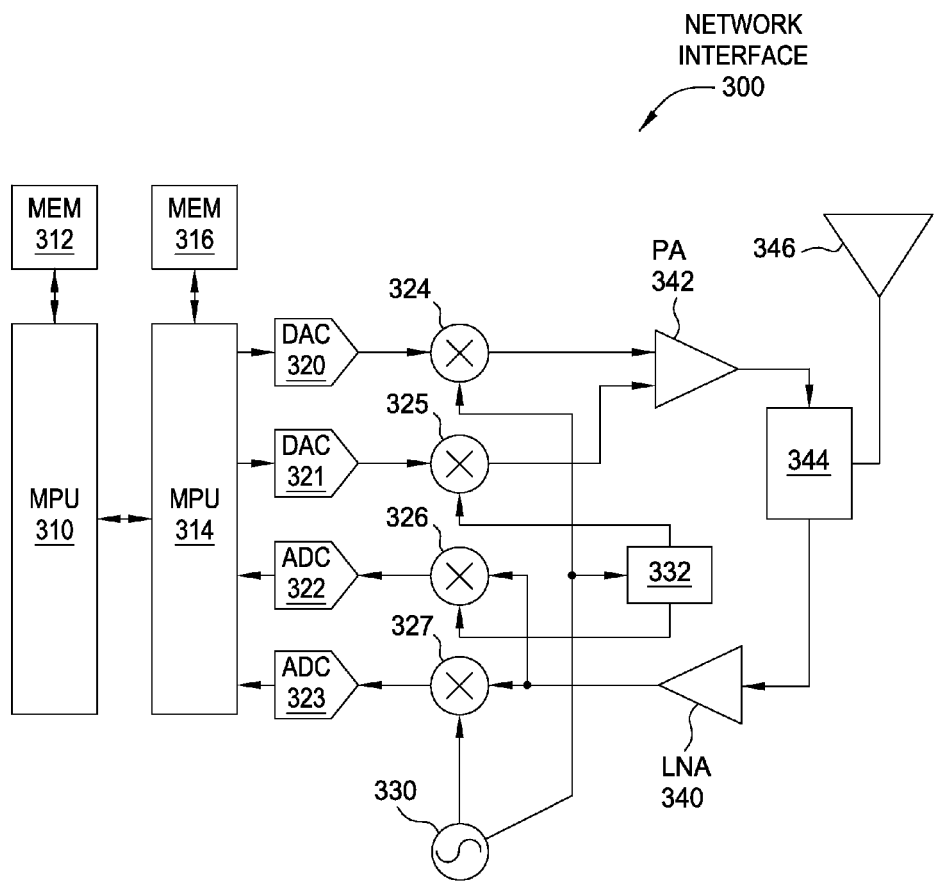
FIG. 3 illustrates a network interface configured to implement multi-channel operation within a node of the mesh network of FIG. 2, according to one embodiment of the present invention.

FIG. 3 illustrates a network interface 300 configured to implement multi-channel operation within a node of wireless mesh network 202 of FIG. 1, according to one embodiment of the invention. Each node 210, 212, 230 within wireless mesh network 202 includes at least one instance of network interface 300. Network interface 300 may include, without limitation, a microprocessor unit (MPU) 310, a digital signal processor (DSP) 314, digital to analog converters (DACs) 320 and 321, analog to digital converters (ADCs) 322 and 323, analog mixers 324, 325, 326, and 327, a phase shifter 332, an oscillator 330, a power amplifier (PA) 342, a low noise amplifier (LNA) 340, an antenna switch 344, and an antenna 346. A memory 312 may be coupled to MPU 310 for local program and data storage. Similarly, a memory 316 may be coupled to DSP 314 for local program and data storage. Memory 312 and/or memory 316 may be used to store data structures such as, e.g., a forwarding database, and/or routing tables that include primary and secondary path information, path cost values, and so forth.

In one embodiment, MPU 310 implements procedures for processing IP packets transmitted or received as payload data by network interface 300. The procedures for processing the IP packets may include, without limitation, wireless routing, encryption, authentication, protocol translation, and routing between and among different wireless and wired network ports. In one embodiment, MPU 310 implements the techniques performed by the node, as described in conjunction with FIGS. 2 and 4-10, when MPU 310 executes firmware and/or software programs stored in memory within network interface 300.

MPU 314 is coupled to DAC 320 and DAC 321. Each DAC 320, 321 is configured to convert a stream of outbound digital values into a corresponding analog signal. The outbound digital values are computed by the signal processing procedures for modulating one or more channels. MPU 314 is also coupled to ADC 322 and ADC 323. Each of ADC 322 and 323 is configured to sample and quantize an analog signal to generate a stream of inbound digital values. The inbound digital values are processed by the signal processing procedures to demodulate and extract payload data from the inbound digital values. Persons having ordinary skill in the art will recognize that network interface 300 represents just one possible network interface that may be implemented within wireless mesh network 202 shown in FIG. 2, and that any other technically feasible device for transmitting and receiving data may be incorporated within any of the nodes within wireless mesh network 202. As a general matter, server 254 of FIG. 2 configures and manages the operation of each node 230 where network interface 300 resides.

Figure 4:
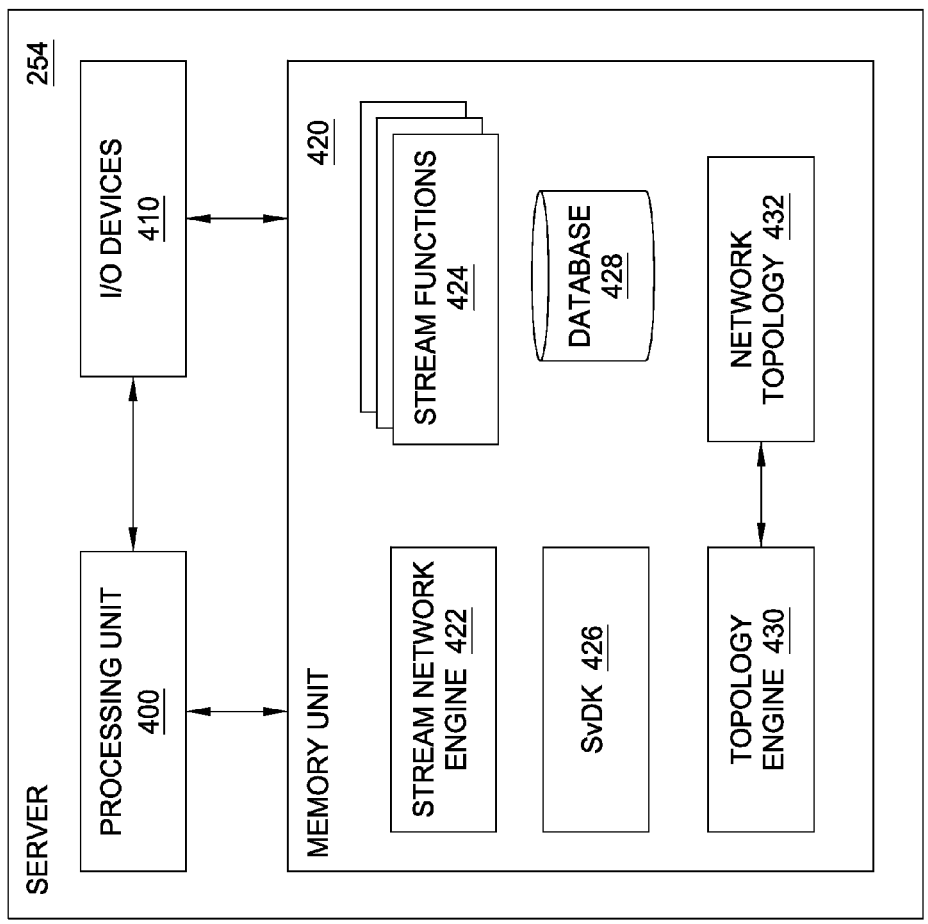
FIG. 4 is a more detailed illustration of the server that is coupled to the mesh network of FIG. 2, according to one embodiment of the present invention.

FIG. 4 is a more detailed illustration of the server that is coupled to the mesh network of FIG. 2, according to one embodiment of the present invention. As shown, server 254 includes a processing unit 400, input/output (I/O) devices 410, and a memory unit 420, coupled together. Memory unit 420 includes database 428, topology engine 430, and network topology 432. In embodiments directed towards implementations involving streams or a stream network, memory unit 420 also includes stream network engine 422, stream functions 424, and stream software development kit (SvDK) 426.

Processing unit 400 may be any technically feasible hardware unit or collection of units configured to process data, including a central processing unit (CPU), a graphics processing unit (GPU), a parallel processing unit (PPU), a field-programmable gate array (FPGA), an application-specific integrated circuit (ASIC), or any combination thereof. Processing unit 400 is configured to perform I/O operations via I/O devices 410, as well as to read data from and write data to memory unit 420. In particular, processing unit 400 is configured to execute topology engine 430 to generate network topology 432. Additionally, in stream-network based implementations, processing unit 400 is also configured to execute stream network engine 422 and SvDK 426, and to generate and/or modify stream functions 424 and read from and/or write to database 428.

I/O devices 410 may include devices configured to receive input, such as, e.g., a keyboard, a mouse, a digital versatile disc (DVD) tray, and so forth. I/O devices 410 may also include devices configured to generate output, such as, e.g., a display device, a speaker, a printer, and so forth. I/O devices 410 may further include devices configured to both receive input and generate output, such as a touchscreen, a data port, and so forth. I/O devices generally provide connectivity to the Internet, and, specifically, to wireless mesh network 202.

Memory unit 420 may be any technically feasible unit configured to store data, including a hard disk, random access memory (RAM), etc. The stored data may include structured data sets, program code, software applications, and so forth. Stream network engine 422 is a software application that may be executed by processing unit 400 in the context of stream-based implementations to establish and maintain the stream network discussed above in conjunction with FIG. 2, and, further, shown below in FIG. 9. In doing so, stream network engine 422 configures nodes 230 within mesh network 202 to execute various stream functions 424. Stream functions 424 may be preconfigured to reside within memory unit 420 of server 254 or may be specified by utility customers of distribution network 100 via SvDK 426. In one embodiment, the functionality of stream network engine 422 is performed within distributed processing cloud 260 of FIG. 2. In another embodiment, server 254 executes stream network engine 422 to configure distributed processing cloud 260 to manage nodes 230 and/or execute the stream functions described above.

SvDK 426 is a software application that, when executed by processing unit 400 in the context of stream-based implementations, provides a development kit to utility customers that allows creation of stream functions 424. SvDK 426 is configured to generate a graphical user interface (GUI) that supports drag-and-drop construction of stream functions and/or node monitoring rules, among other possibilities. SvDK 426 is configured to expose an abstract set of libraries to the customer that encapsulates various application programming interface (API) calls. These abstract libraries enable the customer to generate complex stream functions that are implemented by complex underlying code, yet require no actual coding on the part of the customer.

SvDK 426 may include server-side code that executes on processing unit 400 as well as client-side code that executes on a remote computing device associated with a utility customer, as well as code that executes on distributed processing cloud 260. In one embodiment, SvDK 426 may be a web application that provides users with access to a library of function calls for performing data processing on time series data, including raw time series data generated by a node 230 as well as aggregated data stream time series data received from other nodes. The user may specify a stream function by assembling various function calls via the GUI described above in any desired fashion to process the time series data. The library of function calls and other data used by SvDK 426 may be stored in a local database 428, among other places. Those function calls generally encapsulate specific programmatic operations, including database operations and data processing algorithms. Generally, SvDK 426 allows utility customers to customize a specific portion of the stream network that operates in conjunction with mesh network 202.

In stream-based implementations and non-stream implementations alike, each node 230 is configured to detect when zero crossings occur as well as the time of occurrence of each such crossing. In embodiments directed towards stream-based implementations, each node 230 is also configured to execute a stream function that causes those nodes to process zero crossing data in a distributed manner in order to determine the phase associated with each node 230. The phase information is then transmitted to server 254 in order to generate network topology 432. Network topology 432 is a dataset that reflects the topology of power distribution network 100. Network topology 432 may also be referred to as "grid topology" or "electric grid topology."

In other embodiments directed towards non-stream implementations, each node 230 transmits zero crossing data to server 254 for centralized processing. Server 254 executes topology engine 430 to process the aggregated zero crossing information in order to determine the phase associated with each node 230. Once the phase of each node 230 is determined, server 254 generates network topology 432. The different techniques for generating network topology 432 are described in greater detail below in conjunction with FIGS. 5-10.

Determining Grid Topology

Figure 5:
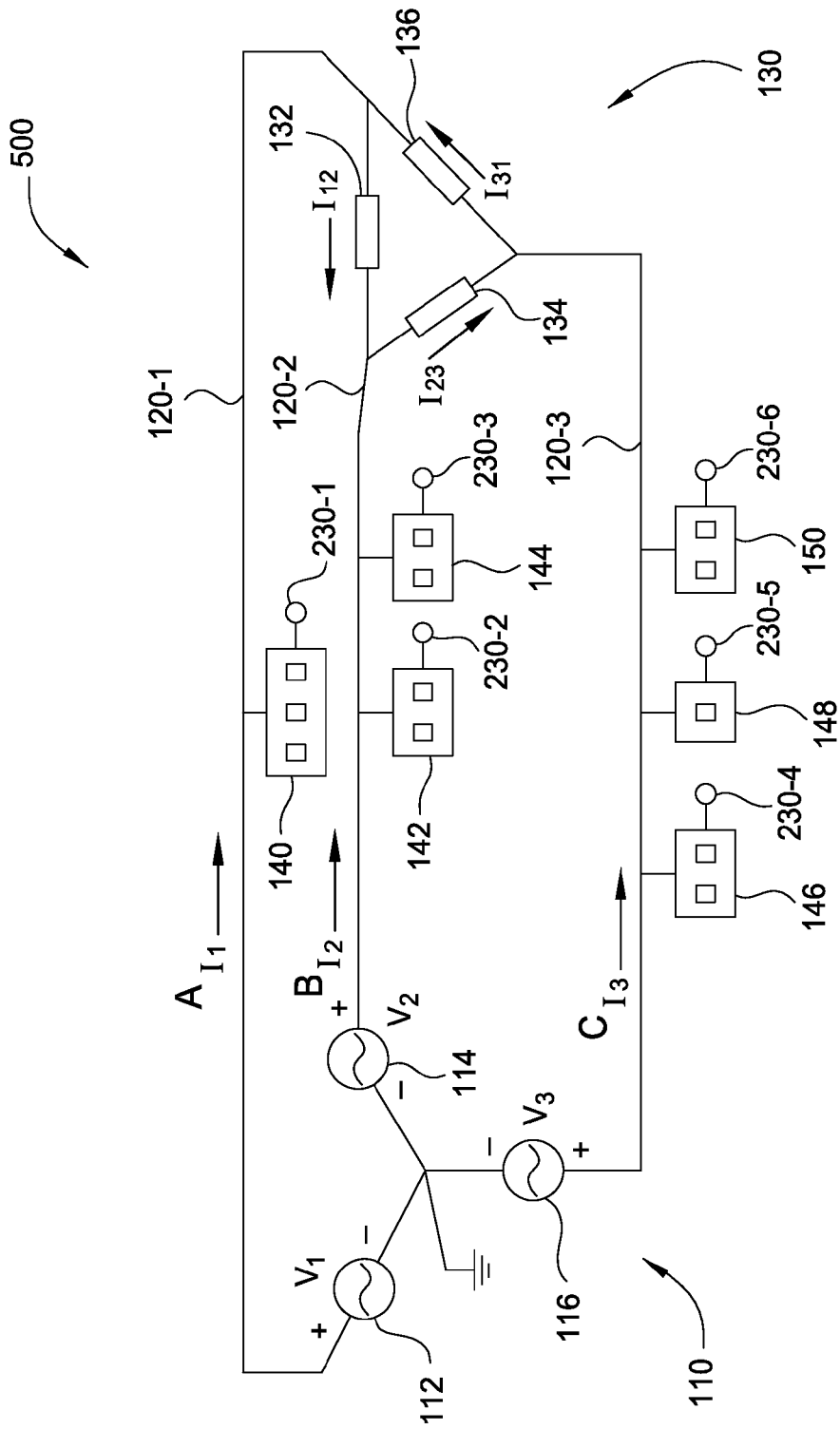
FIG. 5 illustrates a set of nodes that forms a portion of the mesh network of FIG. 2 coupled to the power distribution network of FIG. 1, according to one embodiment of the present invention.

FIG. 5 illustrates a set of nodes that forms a portion of the mesh network of FIG. 2 coupled to the distribution network of FIG. 1, according to one embodiment of the present invention. As shown, node 230-1 is coupled to single-phase consumer 140, node 230-2 is coupled to single-phase consumer 142, node 230-3 is coupled to single-phase consumer 144, node 230-4 is coupled to single-phase consumer 146, node 230-5 is coupled to single-phase consumer 148, and node 230-6 is coupled to single-phase consumer 150. Nodes 230-1 through 230-6 are also coupled together via communication links 232 in the fashion shown in FIG. 2, thereby forming a portion of wireless mesh network 202.

Nodes 230-1 through 230-6 represent power meters configured to monitor the power consumption of the single-phase power consumers coupled to distribution network 100. In doing so, each node 230 monitors voltage levels at the corresponding single-phase power consumer and determines when those voltage levels cross from a positive voltage value to a negative voltage value (a zero crossing), and the precise time when that zero crossing occurs. By comparing zero crossing data across all nodes 230, the phase (A, B, or C) of current or voltage drawn by each single-phase power consumer can be determined. Since each power line 120 transports power having a different phase, the phase associated with a given single-power consumer indicates the power line 120 to which that consumer is coupled. Accordingly, the network topology as a whole can be determined by comparing zero crossing information across all nodes. As mentioned above, the comparison of zero crossing information may be performed in a centralized manner by server 254 or in a distributed manner across nodes 230. Based on the network topology, the utility provider may then effectively balance the loading across power lines 120. The technique described generally above is described in greater detail below in conjunction with FIGS. 6-10.

Figure 6:
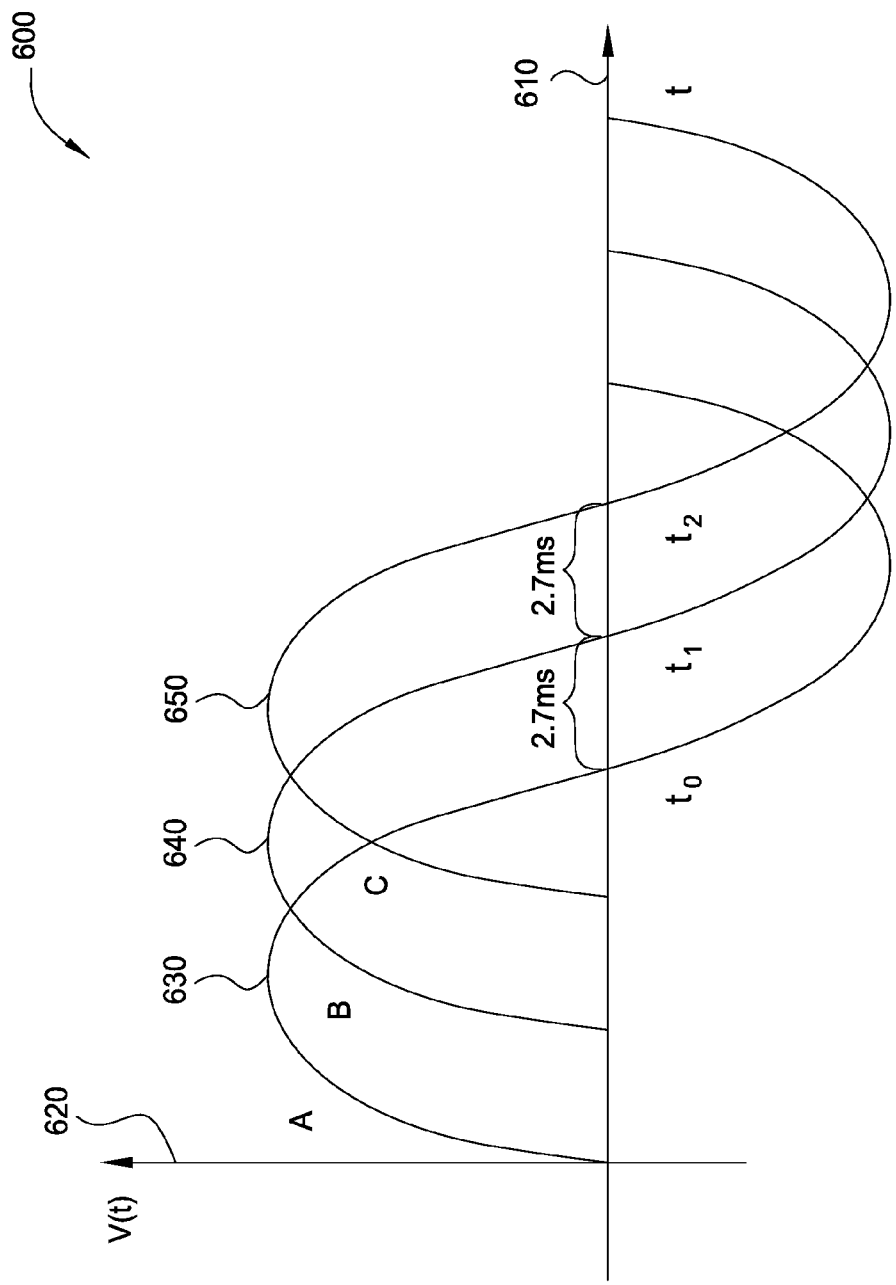
FIG. 6 is a graphical representation of the zero crossings of three-phase power consumed by the power consumers shown in FIG. 5 and monitored by the nodes of FIG. 5, according to one embodiment of the present invention.

FIG. 6 is a graphical representation of the zero crossings of three-phase power consumed by the power consumers shown in FIG. 5 and monitored by the nodes of FIG. 5, according to one embodiment of the present invention. As shown, graph 600 includes time axis 610 and voltage axis 620. Voltage levels 620, 630, and 640 are plotted against time axis 610 and voltage axis 620 and represent the voltage flowing through power lines 120-1, 120-2, and 120-3, respectively, as a function of time. Voltage levels 620, 630, and 640 reflect various alternating voltages that are sinusoidal in nature and have specific phases A, B, and C, respectively. As with conventional three-phase power, phase A is offset from phase B by approximately 2.7 ms, and phase B is offset from phase C by approximately 2.7 ms. Other phase differences also fall within the scope of the invention. Voltage level 620 crosses zero at time $t_0$, voltage level 630 crosses zero at time $t_1$, and voltage level 630 crosses zero at time $t_2$. The times at which these zero crossings occur are reflective of the phase differences between voltage levels 620, 630, and 640. Specifically, $t_0$ and $t_1$ occur 2.7 ms apart, and $t_1$ and $t_2$ occur 2.7 ms apart.

By comparing zero crossings across any two nodes 230, the determination can be made (e.g., by server 254 or nodes 230) whether those nodes 230 have the same phase or a different phase. In the latter case, the determination can also be made whether the phase of the first node leads the phase of the second node or lags the phase of the second node. For example, suppose a first node 230 records a zero crossing at time $t_0$ and a second node 230 also records a zero crossing at time $t_0$. Since those zero crossings occurred at the same time $t_0$, then the first and second nodes have the same phase. Alternatively, suppose the first node 230 records a zero crossing at time $t_0$ and the second node 230 records a zero crossing at time $t_1$. Then, the second node 230 has a phase that lags the phase of the first node 230. Again, either nodes 230 or server 254 can make the above determinations.

In both of the above examples, the comparison of zero crossing information is not sufficient to positively determine the exact phase (A, B, or C) of each of the first and second nodes 230; only the relative phase differences between those nodes can be determined. However, if the precise phase of either of those two nodes has been positively identified, then the precise phase of the other node may be logically inferred. In particular, if the two nodes are determined to have the same phase based on a zero crossing comparison, and the first node 230 is known to have phase A, then logically the second node also has phase A. Likewise, if the phase of the second node is determined to lag the phase of the first node by 2.7 ms (again, based on a zero crossing comparison), and the first node is known to have phase A, and logically the second node 230 has phase B.

In short, the precise phase of each node 230 shown in FIG. 5 can be determined by (i) comparing zero crossing information between pairs of nodes to determine phase differences between those pairs of nodes, and (ii) logically inferring the precise phase of each node based on the positive identification of the phase of at least one node. Persons skilled in the art will recognize that the approach described above is applicable to any alternating parameter measured by node 230, including voltage levels, as described above, as well as current levels or other measurable quantities. The general approach described above is also illustrated by way of example below in FIGS. 7A-7C.

Figure 7A:
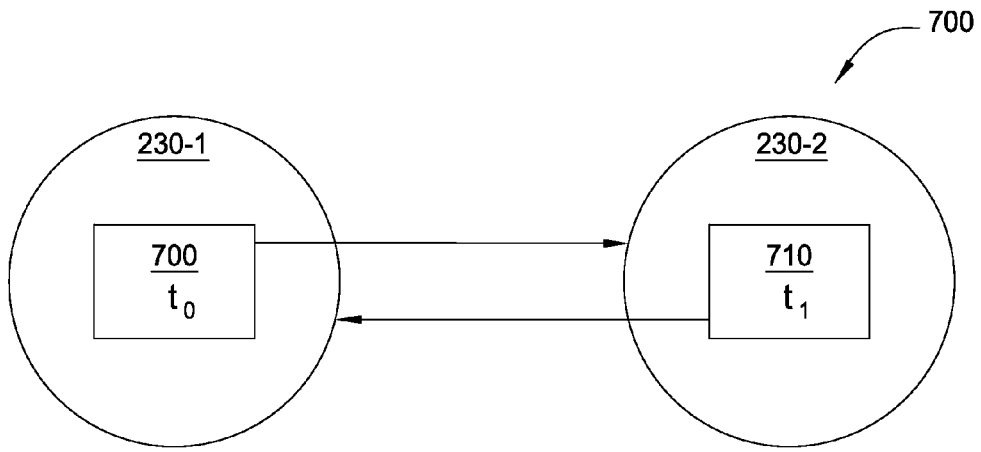
FIGS. 7A-7D illustrate exemplary scenarios in which the nodes of FIG. 5 exchange zero crossing data to identify phase differences between power consumers coupled to those nodes, according to one embodiment of the present invention.
Figure 7B:
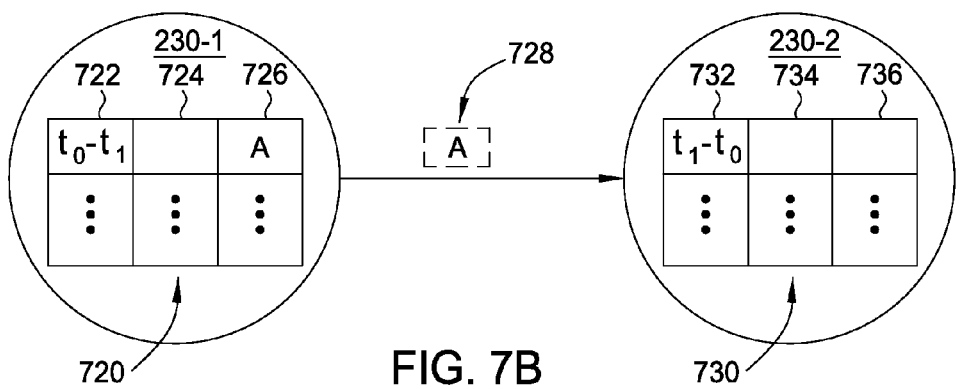
Figure 7C:
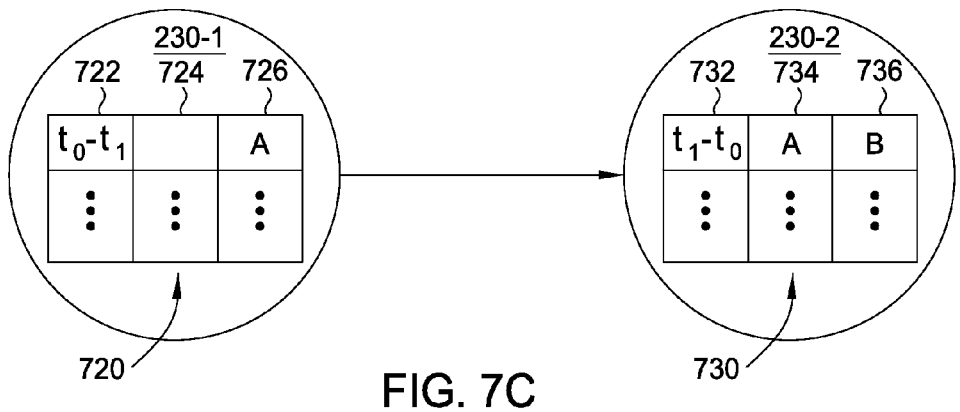

FIGS. 7A-7C illustrate exemplary scenarios in which the nodes of FIG. 5 exchange zero crossing data to identify phase differences between power consumers coupled to those nodes, according to one embodiment of the present invention. In the example described herein, the comparison of zero crossing information occurs in a distributed manner across nodes 230. However, persons skilled in the art will understand that server 254 may implement an analogous technique in a centralized fashion. As a general matter, the techniques described in conjunction with FIGS. 7A-7D may be applicable to stream-based implementations and non-stream implementations alike. Further, differential measurements of current, rather than voltage, may be used to determine relative phase.

In FIG. 7A, node 230-1 records a zero crossing at time $t_0$ and then generates zero crossing data 700. Likewise, node 230-2 records a zero crossing at time $t_1$ and then generates zero crossing data 710. Nodes 230-1 and 230-2 are configured to exchange zero crossing data 700 and 710 with one another.

In FIG. 7B, node 230-1 includes phase data table 720. Phase data table 720 includes phase difference column 722, neighbor phase column 724, and self-phase column 726. Phase data table 720 may include a different row for each different node neighboring node 230-1. Node 230-1 populates each such row based on zero crossing data exchanged with neighboring nodes 230, and, potentially, based on phase identification data shared by neighboring nodes 230.

Upon receiving zero crossing data 710 from node 230-2, node 230-1 populates phase data table 720 with data that reflects the relative time difference between zero crossings 700 and 710; specifically, $t_0 - t_1$. This time difference indicates whether the phase of node 230-1 is equal to, leads, or lags that of node 230-2. If the value $t_0 - t_1$ is zero, then nodes 230-1 and 230-2 have equal phase. If the value $t_0 - t_1$ is negative, then the phase of node 230-1 leads that of node 230-2. If the value $t_0 - t_1$ is positive, then the phase of node 230-1 lags that of node 230-2. In the example discussed herein, the value $t_0 - t_1$ is negative, indicating that the phase of node 230-1 leads that of node 230-2.

Similar to node 230-1, node 230-2 includes a phase data table 730, which includes phase difference column 732, neighbor phase column 734, and self-phase column 736. Like phase data table 720, phase data table 730 may include a different row for each different node that neighbors node 230-2. Node 230-2 populates each such row based on zero crossing data exchanged with neighboring nodes 230, and, potentially, based on phase identification data shared by neighboring nodes 230.

Upon receiving zero crossing data 700 from node 230-1, node 230-2 populates phase data table 730 with data that reflects the relative time difference between zero crossings 710 and 700; specifically, $t_1-t_0$. This time difference indicates whether the phase of node 230-2 is equal to, leads, or lags that of node 230-1. If the value $t_1-t_0$ is zero, then nodes 230-2 and 230-1 have equal phase. If the value $t_1-t_0$ is negative, then the phase of node 230-2 lags that of node 230-1. If the value $t_1-t_0$ is positive, then the phase of node 230-2 leads that of node 230-1. In the example discussed herein, the value $t_1-t_0$ is negative, indicating that the phase of node 230-2 lags that of node 230-1.

By populating phase data tables 720 and 730 in this fashion, nodes 230-1 and 230-2 record phase differences relative to one another. As mentioned above, this information is insufficient to positively identify the particular phase A, B, or C with which each node is associated. However, if the phase of one of nodes 230-1 or 230-2 has been positively identified, then the phase of the other node may be logically inferred.

In the example discussed herein, self-phase column 726 within phase table 720 indicates that node 230-1 is associated with phase A, as is shown. The utility provider may determine the phase of node 230-1 by visual inspection (e.g., "walking the line"), and/or may rely on previously generated or recorded grid topology data. The utility provider may store phase identification data for node 230-1 in self-phase column 726. Node 230-1 may then share phase identification data 728 with node 230-2, indicating to node 230-2 that node 230-1 is associated with phase A.

In FIG. 7C, node 230-2 stores phase identification data 728 in neighbor phase column 734. Since the value $t_1-t_0$ is positive, indicating that the phase of node 230-2 lags that of node 230-1, and the phase associated with node 230-1 is phase A, node 230-2 infers that node 230-2 is associated with phase B, since phase B lags phase A. Node 230-2 may then store this phase identification information in self-phase column 736 for sharing with other neighboring nodes 230. This general process may occur between any two pairs of nodes across mesh network 202. Accordingly, node 230-2 may perform a similar process to that described above with another neighboring node, and the other neighboring node may then infer an associated phase based on the previously inferred phase of node 230-2. In this fashion, nodes 230 may infer their respective phases based on zero crossing data and phase identification data shared between neighboring nodes, as also shown in FIG. 7D.

Figure 7D:
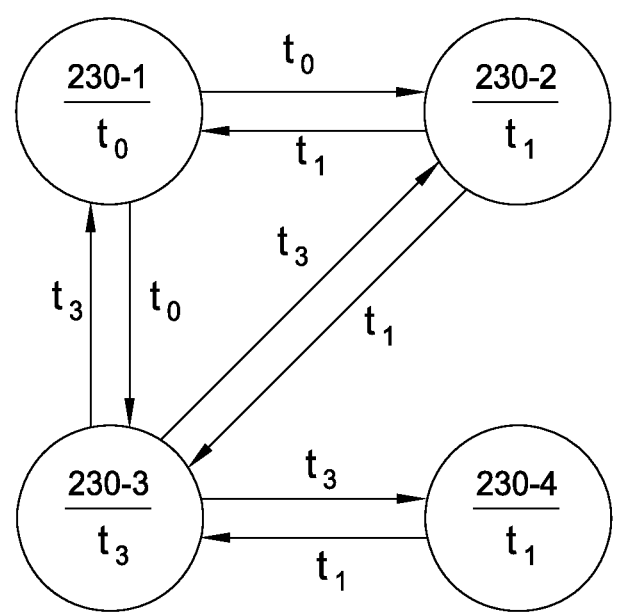

In FIG. 7D, nodes 230-1, 230-2, 230-3, and 230-4 exchange zero crossing data with one another. In addition, those nodes 230 may also share phase identification data in the manner described above in conjunction with FIG. 7C. Phase identification data propagates across nodes 230 starting with any nodes for which the phase has been positively identified; in this example, node 230-1.

In one embodiment, each node 230 maintains a clock from which timestamps are recorded when zero crossings occur. Clocks between neighboring nodes may diverge over time, potentially leading to erroneous timestamps for zero crossings. However, each node 230 is configured to routinely exchange clock data with neighboring nodes 230 in order to determine clock divergences between those nodes. Each node 230 may then store clock divergence data that indicates clock divergence relative to neighboring nodes 230. The clock divergence data can be used to correct timestamps associated with zero crossings detected by those neighboring nodes 230.

For example, each of nodes 230-1 and 230-1 could maintain a clock according to which timestamps are generated when zero crossings are detected. Nodes 230-1 and 230-2 could periodically exchange clock values with one another by exchanging packets that indicate the precise time when those packets were sent. Node 230-1 would receive a packet from node 230-2 and compare the time the packet was sent with the time the packet was received, and then determine a time difference indicating a clock divergence relative to node 230-2. Node 230-1 could also correct for a transmission time associated with transmitting the packet. Node 230-2 would perform an analogous process. Then, when nodes 230-1 and 230-2 exchange zero crossing data with one another, those nodes may correct the timestamps associated with that zero crossing data based on the pre-computed time divergence data. This approach potentially leads to a more accurate determination of the phase of each node 230.

By implementing the aforementioned techniques, a given node may be configured to determine the phase associated with power (or any other parameter) that the node is configured to monitor, and may thus determine which power line 120-1 the associated single-phase power consumer is coupled. Nodes 230 may transmit this data to topology engine 430 within server 254, and topology engine 430 may then generate network topology 432.

In other embodiments, nodes 230 may transmit zero crossing data directly to server 254. Topology engine 430 may then compare zero crossing data between neighboring nodes, determine whether each pair of nodes have equal, leading, or lagging phases relative to one another, and then infer any undetermined phases based on those that have been positively identified. This approach is analogous to that described above in conjunction with FIGS. 7A-7D, except that topology engine 430 performs the overall functionality described in those Figures in a centralized manner.

Once topology engine 432 has generated network topology 432, using either the centralized approach or the distributed approach, the utility provider may analyze the network topology and determine which, if any, single-phase power consumers should be migrated from one power line 120 to another in order to balance the loading of those power lines. The utility provider may also rely on network topology 432 in order to recommend which of power lines 120-1, 120-2, or 120-3 new single-phase power consumers should be coupled. The approach described thus far is also described in stepwise fashion below in conjunction with FIG. 8.

Figure 8:
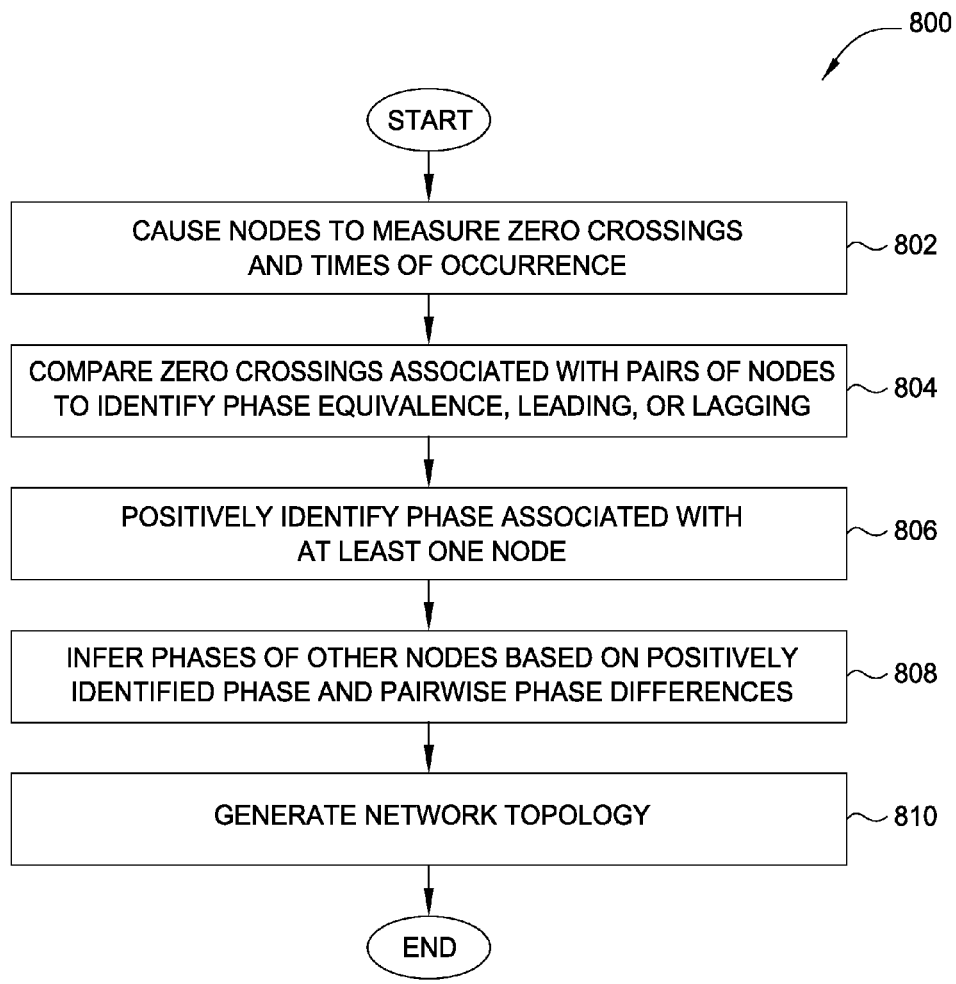
FIG. 8 is a flow diagram of method steps for determining the network topology of a power distribution network based on zero crossing data associated with power consumers within that network, according to one embodiment of the present invention.

FIG. 8 is a flow diagram of method steps for determining the network topology of a power distribution network based on zero crossing data associated with power consumers within that network, according to one embodiment of the present invention. Although the method steps are described in conjunction with the systems of FIGS. 1-7, persons skilled in the art will understand that any system configured to perform the method steps, in any order, is within the scope of the present invention.

A method 800 begins at step 802, where topology engine 430 within server 254 causes each node 230 within mesh network 202 to record zero crossings associated with alternating voltage levels those nodes are configured to monitor. Server 254 also causes each node 230 to record the time when such zero crossings occur to generate timestamped zero crossing data.

At step 804, topology engine 430 compares zero crossing data associated with pairs of nodes 230 to identify phase equivalence, phase leading, or phase lagging between those pairs. In doing so, topology engine 430 generates pairwise phase difference data for each pair of nodes. The pairs of nodes could be neighboring nodes, or any two nodes within mesh network 202.

At step 806, topology engine 430 determines the phase associated with at least one node 430. In doing so, topology engine 430 may rely on previous a previously generated network topology, or may receive input indicating the phase of at least one node 230 following a visual inspection of distribution network 100.

At step 808, topology engine 430 determines the phases of other nodes 230 based on the determined phase and the pairwise phase difference data generated at step 804. In doing so, topology engine 430 may rely on any sort of computer-implemented logical inference to determine those phases. At step 808, topology engine 430 generally implements the process described in conjunction with FIGS. 7A-7D. Once topology engine 430 determines the phase of each node 230, topology engine 430 then determines the power line 120 associated with each node, and, thus, the single-phase power consumer coupled to each power line.

At step 810, topology engine 430 generates network topology 432 to reflect a correspondence between single-phase power consumers and power lines 120. As mentioned above, the network topology reflects which power lines 120 each different single-phase consumer is coupled to. Topology engine 430 determines the coupling between power lines 120 and single-phase consumers based on (i) the known phase of each power line 120 and (ii) the determined phase of each node. Based on this topology data, the utility provider may then balance the loads across power lines 120 by migrating single-phase power consumers between those power lines.

As previously mentioned, the techniques described herein for determining network topology 432 may be implemented in a centralized manner by server 254, as described above in conjunction with FIG. 8, or in a distributed fashion across nodes 230. In certain embodiments, mesh network 202 may be configured to implement the stream network discussed in conjunction with FIG. 4. In these embodiments, nodes 230 may be configured to execute stream function to generate streams that reflect zero crossing data, phase identification data, and so forth. FIG. 9 provides an overview of the stream network mentioned above.

Determining Grid Topology Via Stream Processing

Figure 9:
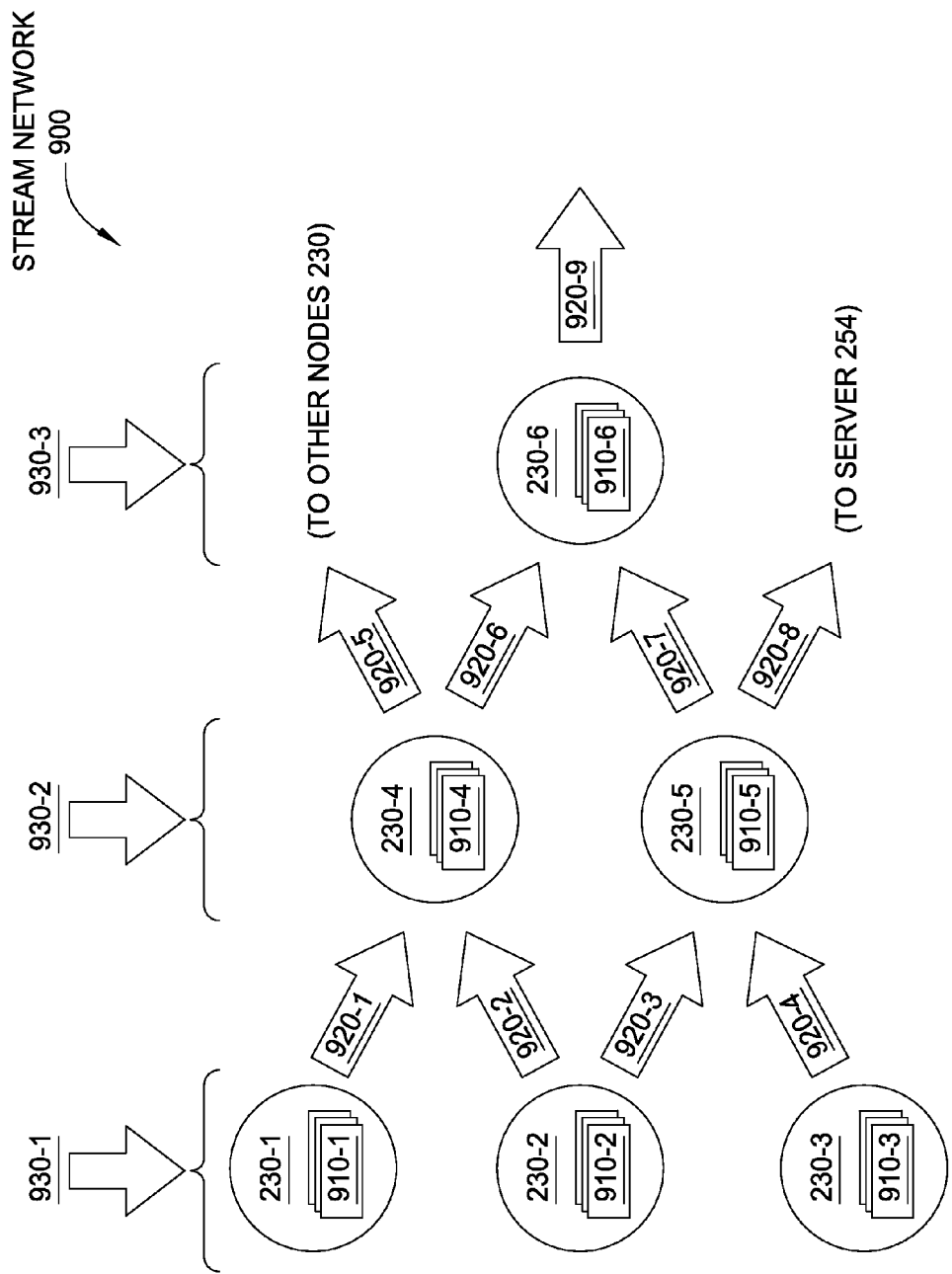
FIG. 9 illustrates a stream network 900 configured to operate in conjunction with mesh network of FIG. 2, according to one embodiment of the present invention.

FIG. 9 illustrates a stream network 900 configured to operate in conjunction with mesh network 202 of FIG. 2, according to one embodiment of the present invention. As illustrated in greater detail below, stream network 900 operates above mesh network 202 of FIG. 2 in an overall network architecture. As shown, nodes 230 of mesh network 202 execute stream functions 910 in order to generate data streams 920.

Specifically, node 230-1 executes stream functions 910-1 to generate data stream 920-1, node 230-2 executes stream function 910-2 to generate data streams 920-2 and 920-3, node 230-3 executes stream functions 910-3 to generate data stream 920-4, node 230-4 executes stream functions 910-4 to generate data streams 920-5 and 920-6, node 230-5 executes stream functions 910-5 to generate data streams 920-7 and 920-8, and node 230-6 executes stream functions 910-6 to generate stream function 920-9. Each data stream 920 includes a time series of data elements, where each data element includes a data value and a corresponding timestamp indicating a time when the data values was recorded or generated.

A given node 230 may execute one or more stream functions 910 to process raw time series data generated by that node 230. A stream function 910 may be a Boolean operation, such as, e.g., a comparison, or a more complex, higher-level function, such as a correlation operation. The raw time series data processed by stream functions generally includes various types of sensor data, such as voltage data, current measurements, temperature readings, and other types of environmental information. The raw time series data may also include sensor data reflective of the operating conditions of node 230. Further, the raw time series data may include network status information, traffic measurements, alternating current or voltage levels drawn by a single-phase consumer to which the node is coupled, zero crossing data, phase difference data, and so forth.

In one embodiment, each node 230 is configured to access time series data that is derived from various social media outlets, such as Twitter® or Facebook®, among other possibilities. Node 230 could, for example, retrieve tweets in real-time (or near real-time) via an API provided by Twitter®. Node 230 is configured to process the raw time series data to generate one or more data streams 920, and to then transmit the generated data stream(s) 920 to neighboring nodes. Data streams generated by processing raw time series data may be referred to herein as "native data streams."

A given node 230 may also execute one or more stream functions 910 to process data streams 920 received from neighboring nodes 230. A received data stream 920 could be generated by an upstream node 230 based on raw time series data recorded by that node, or generated based on other data streams 920 received by that upstream node. A given data stream 920 could reflect, for example, zero crossing data or phase identification data. Similar to above, node 230 is configured to process received data streams 920 to generate additional data streams 920, and to then transmit these data stream(s) 920 to neighboring nodes. Data streams generated by processing other data streams may be referred to herein as "abstract data streams."

Upon generating a data stream 920, node 230 is configured to transmit the data stream 920 to server 254 and/or distributed processing cloud 260. In the embodiment described herein, server 254 operates according to a stream-based implementation, as described above in conjunction with FIG. 4. Stream network engine 422 within server 254 collects data streams 920 from nodes 230 within wireless mesh network 202 and may then perform various additional processing operations with those data streams 920 to identify network events associated with distribution network 100 and/or wireless mesh network 202 as well as consumption data. In doing so, server 254 may characterize time series data associated with nodes 230, including raw time series data and received data streams, and then identify network events associated with abnormal patterns within that time series data. Those network events may include voltage sags/swells, downed power lines, appliance malfunctions, potential fires, and fraud, among others. Server 254 may also process time series data to identify expected or normal patterns, including consumption data, quality of service data, etc. Server 254 may then analyze this data to compute load predictions, demand estimations, and so forth.

For example, a given node 230 could be configured to participate in identifying voltage swells (or sags) by executing a stream function that generates a running average of voltage levels associated with the node 230. When the voltage level at a given point in time exceeds (or falls below) the running average by a threshold amount, value, node 230 could alert server 254. Server 254 could then identify that a voltage swell (or sag) is occurring in the region where the node resides. Server 254 could also identify voltage swells or sags by correlating multiple alerts received from multiple nodes 230 residing within the same region. In general, a node 230 may combine data associated with other devices or data streams to draw insights that reflect consumption, service quality and usage, as well as bill forecasts.

In another example, a given node 230 could be configured to execute a stream function that generates a running average of voltage load associated with a transformer to which the node 230 is coupled. When the running average exceeds a threshold level, the node 230 could notify server 254 that a fire may be imminent. The node 230 could also compute the threshold value dynamically by executing a stream function on time series data that reflects ambient temperature associated with the node 230. The node 230 could then adjust the threshold based on the type of transformer, e.g., by executing a stream function to parse nameplate data associated with that transformer and then generate a nominal load value for that particular type of transformer. The node 230 could also receive the threshold value from server 254.

In yet another example, a given node 230 could be configured to participate in identifying fraud by executing a stream function to characterize usage patterns associated with a consumer to which the node 230 is coupled and then identify patterns commonly associated with fraud. When a usage pattern commonly associated with fraud is detected, the node 230 could notify server 254. Such a pattern could be abnormally high consumption compared to neighboring consumers, or divergence between measured load at a transformer coupling a set of meters together and total consumed power at those meters, among other possibilities.

Persons skilled in the art will recognize that stream functions designed for performing computations related to any consumable utility may also be applicable to any other consumable utility. For example, the fraud detection techniques outlined above may be applied to identify loss in the context of water consumption. SvDK 426 of FIG. 4 is configured to allow stream functions generated for one utility to be applied to performing analogous computations with another utility.

A given node 230 may identify network events based on parsing data streams collected from a social media outlet (such as the Twitter® API, among others). For example, a data stream gathered from a social media outlet could reflect descriptions of downed power lines, fallen trees, and other events that may impact the functionality of wireless mesh network 202 and distribution network 100. Node 230 could execute a stream function to search that data stream for specific references to such events. Users that contribute to the social media outlet mentioned above would generally create the descriptions included in the data stream in the form of posts, tweets, etc. Node 230 could assign a credibility factor or confidence value to each user in order to validate those descriptions. In this fashion, node 230, and stream network 900 as a whole, may incorporate qualitative data provided by human beings with some level of confidence.

Generally, stream network 900 may be configured to perform a wide variety of distributed processing operations to identify events occurring within underlying networks, including wireless mesh network 202 and distribution network 100. Stream network 900 may also be configured to perform general processing operations (i.e., beyond event identification). In one embodiment, server 254 and/or distributed processing cloud 260 may implement a map-reduce type functionality by mapping stream functions to nodes, and then reducing data streams generated by execution of the mapped stream functions by collecting and processing those data streams. In this fashion, server 254 is capable of configuring stream network 900 to operate as a generic, distributed computing system. Persons skilled in the art will recognize that server 254 may configure stream network 900 to implement any technically feasible form of distributed processing, beyond map-reduce. Generally, stream network 900 reflects a distributed computing system that combines the processing, extrapolation, interpolation, and analysis of data streams using real-time and historical streams via in-line and parallel batch processing.

In one embodiment, server 254 and/or distributed processing cloud 260 are configured to orchestrate the distribution of processing tasks and/or data storage across the various nodes 230 within stream network 900 in a centralized manner. In doing so, server 254 and/or distributed processing cloud 260 may assign specific processing operations to different nodes, allocate particular amounts of data storage to different nodes, and generally dictate some or all configuration operations to those nodes.

In another embodiment, nodes 230 perform a self-orchestration procedure that occurs in a relatively distributed fashion, i.e. without the involvement of a centralized unit such as server 254 or distributed processing cloud 260. In doing so, each node 230 may execute a stream function in order to negotiate processing and/or data storage responsibilities with neighboring nodes. Nodes 230 may perform such negotiations in order to optimize energy usage, processing throughput, bandwidth, data rates, etc. For example, nodes 230 could negotiate a distribution of processing tasks that leverages the processing capabilities of solar powered nodes during daylight hours, and then redistributes those operations to nodes powered by distribution network 100 during non-daylight hours. In another example, a group of nodes 230 could negotiate coordinated communications using a specific data rate to optimize power consumption. At any given time, server 254 and/or distributed processing cloud 260 may assume direct control over nodes 230, thereby causing nodes 230 to transition form self-orchestration to centralized orchestration.

Nodes 230 may initiate specific actions based on the execution of one or more stream functions 910. For example, a given node 230 could execute a stream function 910 that compares temperature and humidity values to threshold temperature and humidity values. The node 230 could then determine that both temperature and humidity have exceeded the respective threshold values for a specific amount of time, and then determine that mold growth is likely at the location occupied by the node. The node 230 could then take specific steps to counteract such growth, including activating a ventilation device, or simply notifying back office 150. Generally, each node 230 is configured to both process and respond to recorded time series data, received data streams, and generated data streams and to generate insights and/or alerts based on such monitoring.

When executing a stream function 910, a given node 230 may receive control parameters 530 from back office 150 that influence the execution of those stream functions 910. For example, node 230-1 could receive control parameters 930-1 that reflects an average expected voltage load at node 230-1. Node 230-1 could record the actual voltage load, compare that recorded value to control parameters 930-1, and then perform a specific action based on the result, such as, e.g., report to a back office facility a binary value indicating whether the average expected voltage load was exceeded, among other possibilities. In the above example, one of stream functions 910-1 executed by node 230-1 would reflect the comparison operation between actual and expected voltage loads.

In one embodiment, server 254 may configure nodes 230 to operate according to a policy that indicates guidelines for interacting with the nodes of other networks. Each node 230 configured according to the policy may share network resources, route packets according to, and generally interoperate with those other nodes based on the policy. For example, node 230 could be configured according to a policy that indicates that 40% of traffic received from a network adjacent to the wireless mesh network 202 should be accepted and routed across wireless mesh network 202 on behalf of the adjacent network. In another example, node 230 could be configured according to another policy that indicates that traffic from a first adjacent network should be routed according to a first set of guidelines, while traffic associated with a second adjacent network should be routed according to second set of guidelines. In yet another example, node 230 could be configured according to a policy that specifies how traffic received from one adjacent network should be routed across wireless mesh network 202 in order to reach another adjacent network. The technique described herein allows new nodes 230 to be added to wireless mesh network and then configured according to the same policy or policies already associated with other pre-existing nodes 230 in the wireless mesh network 202. In addition, this technique allows wireless mesh network 202 to operate in a relatively consistent manner across nodes 230 without requiring continuous querying of server 254 with regard to routing decisions. Instead, nodes 230 need only operate according to the configured policy.

As a general matter, different nodes 230 within stream network 900 may receive different control parameters 930. Each such node 230 may execute stream functions 910, based on received control parameters 930, to process raw time series data and/or received data streams 920. When processing raw time series data, a node 230 may perform error detection and/or correction to modify that time series data, and may also split a given time series into two or more separate time series.

In one embodiment, nodes 230 are configured to execute stream functions to monitor zero crossing events and to generate data streams that reflect the associated zero crossing data for transmission to neighboring nodes. A given node 230 may then compare zero crossing data received from neighboring nodes with zero crossing data generated by that node in order to determine pairwise phase differences with neighboring nodes. Based on a determined phase of any such neighboring node, the given node 230 may then infer the phase associated with alternating current or voltage levels that the node is configured to monitor. The node may then generate a data stream that indicates the inferred phase for transmission to topology engine 430. A similar approach is outlined above in conjunction with FIGS. 7A-7D. This technique is described in stepwise fashion below in conjunction with FIG. 10.

Figure 10:
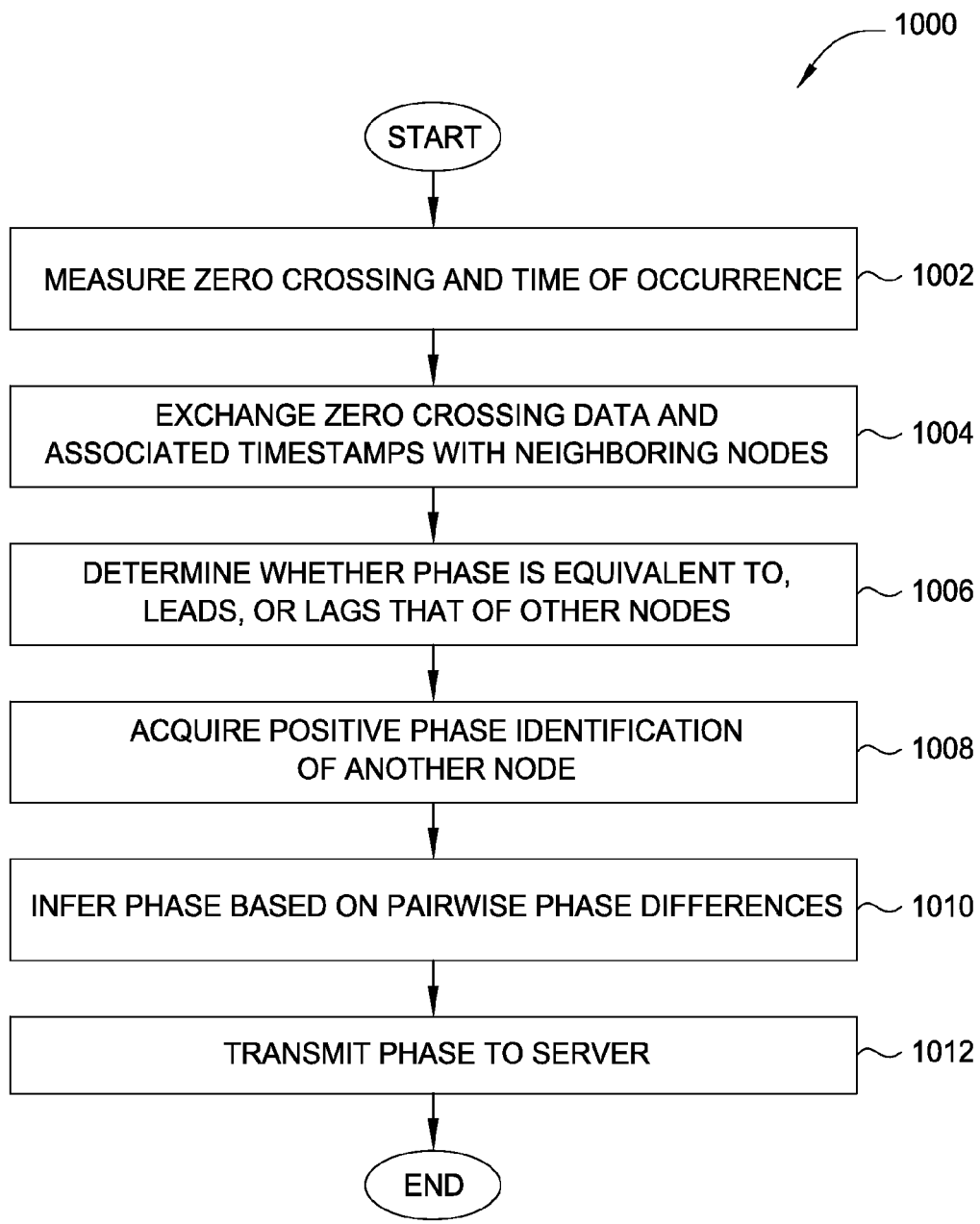
FIG. 10 is a flow diagram of method steps for determining the network topology of a power distribution network based on zero crossing data monitored by a node that is coupled to a power consumer within that network, according to one embodiment of the present invention.

FIG. 10 is a flow diagram of method steps for determining the network topology of a power distribution network based on zero crossing data monitored by a node that is coupled to a power consumer within that network, according to one embodiment of the present invention. Although the method steps are described in conjunction with the systems of FIGS. 1-7, and 9, persons skilled in the art will understand that any system configured to perform the method steps, in any order, is within the scope of the present invention.

As shown, a method 1000 begins at step 1002, where a node 230 within stream network 900 executes a stream function 910 to detect a zero crossing of alternating current or voltage associated with a single-phase power consumer to which the node 230 is coupled. The node 230 also records a timestamp indicating a time when the zero crossing occurred. The single-phase power consumer could be, for example, single-phase power consumer 140 shown in FIGS. 1 and 5 or another one of the single-phase power consumers shown in those figures.

At step 1004, the node 230 executes a stream function 910 to exchange zero crossing data and associated timestamps with neighboring nodes 230 within stream network 900. For example, the node 230 could generate a data stream 920 that includes zero crossing data and associated timestamps. The node 230 would then stream the zero crossing data and associated timestamps to neighboring nodes 230. Those neighboring nodes 230 may similarly stream zero crossing data and associated timestamps to the node 230.

At step 1006, the node 230 executes a stream function 910 to determine whether the phase of the alternating current or voltage monitored by the node 230 is equivalent to, leads, or lags the phase of current or voltage monitored by the neighboring nodes 230. The node 230 may then populate a phase data table, such as that shown in FIGS. 7A-7D, indicating the relative phase differences between the phase associated with the node 230 and the phases associated with the neighboring nodes 230.

At step 1008, the node 230 determines the phase of another node 230. In doing so, the node 230 determines whether the other node 230 is coupled to power with phase A, B, or C. Server 254 could provide the phase of the other node to the node 230, or the node 230 could acquire the phase from one or more neighboring nodes 230 or any other node 230 in mesh network 202. In one embodiment, the utility provider determines the phase of the other node via visual inspection of distribution network 100.

At step 1010, the node 230 executes a stream function 910 to infer the phase of power associated with the node 230 based on the positively identified phase acquired at step 1008 and the pairwise phase difference data generated at step 1006. At step 808, the node 230 generally implements the inference process described in conjunction with FIGS. 7A-7D.

At step 1012, the node 230 executes a stream function 910 to transmit the inferred phase to topology engine 430 within server 254. In doing so, the node 230 may generate and transmit a data stream 920 that reflects the inferred phase of the node 230. Topology engine 430 may then aggregate received phase information from all nodes 230 within stream network 900 to generate network topology 432.

In sum, a node within a wireless mesh network is configured to detect a zero crossings of alternating current or alternating voltage associated with a single-phase power consumer. The node also records a precise timestamp that reflects the time when the zero crossing occurred to generate zero crossing data. The node shares zero crossing data with a neighboring node, and, similarly, receives zero crossing data from the neighboring node. The node then compares the generated zero crossing data with the received zero crossing data in order to generate phase difference data. The phase difference data indicates whether the phase associated with node is equivalent to, leads, or lags the phase associated with the neighboring node. The node then acquires a positive phase identification associated with the neighboring node. Based on the phase identification, and based on the phase difference data, the node infers the phase associated with the single-phase power consumer and, thus, the power line within a three-phase power distribution network to which the single-phase power consumer is coupled. By repeating this process across many nodes, the network topology of the three-phase power distribution network as a whole can be determined.

At least one advantage of the techniques described above is that the utility provider is not required to visually inspect the entire three-phase power distribution network in order to determine the network topology. Accordingly, the costs and human error usually associated with conventional approaches to determining network topology can be reduced or avoided entirely. In addition, since the nodes within the wireless mesh network continuously detect zero crossings, the phases of those nodes can be determined on an ongoing basis, and so the network topology can be kept up-to-date. Maintaining an up-to-date network topology allows single-phase power consumers to be added to specific power lines within the three-phase power distribution network in a manner that balances loads across those power lines, thereby improving the efficiency of the power distribution network as well as three-phase power consumers coupled thereto.

While the foregoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

In view of the foregoing, the scope of the present invention is determined by the claims that follow.

The invention claimed is:

1. A computer-implemented method for determining a network topology associated with a power distribution network, the method comprising:
obtaining first data indicating that a first node within a mesh network identified a first event at a first time;
obtaining second data indicating that a second node within the mesh network identified a second event at a second time;
determining a time difference between the first time and the second time;
determining that the first node is coupled to a first element in the power distribution network that consumes power having a first phase of power;
determining a phase of power associated with a second element in the power distribution network to which the second node is coupled based on the first phase of power and the time difference; and
generating a network topology for controlling the power distribution network that indicates that a power line is coupled to the second element and transports power having the phase of power associated with the second element.

2. The computer-implemented method of claim 1, wherein the first element is coupled to a first power line that transports power with the first phase of power, wherein the first phase of power reflects a phase of voltage associated with the power or a phase of current associated with the power.

3. The computer-implemented method of claim 2, wherein the time difference is equal to zero, both the first element and the second element operate with the first phase of power, and the first element and the second element are both coupled to the first power line.

4. The computer-implemented method of claim 2, wherein the time difference is not equal to zero, the first element and the second element operate with different phases of power, and the first element and the second element are coupled to different power lines.

5. The computer-implemented method of claim 4, wherein the time difference has a negative value, indicating that the phase of power associated with the second element lags the first phase of power.

6. The computer-implemented method of claim 4, wherein the first time difference has a positive value, indicating that the phase of power associated with the second element leads the first phase of power.

7. The computer-implemented method of claim 1, wherein the first event comprises a first zero crossing associated with an alternating current or an alternating voltage monitored by the first node and drawn by the first element, and wherein the first zero crossing occurs when the alternating current or the alternating voltage monitored by the first node crosses from a non-zero value through a zero value.

8. The computer-implemented method of claim 1, wherein the second event comprises a second zero crossing associated with an alternating current or an alternating voltage monitored by the second node and drawn by the second element, and wherein the second zero crossing occurs when the alternating current or the alternating voltage monitored by the second node crosses from a non-zero value through a zero value.

9. The computer-implemented method of claim 1, wherein each of the first element and the second element comprises a single-phase power consumer, and the power distribution network comprises a three-phase power distribution network.

10. The computer-implemented method of claim 1, further comprising determining that the first node is coupled to the first element in the power distribution network based on a previously generated network topology.

11. A non-transitory computer-readable medium storing program instructions that, when executed by a processing unit, cause the processing unit to determine a network topology associated with a power distribution network, by performing the steps of:
obtaining first data indicating that a first node within a mesh network identified a first event at a first time;
obtaining second data indicating that a second node within the mesh network identified a second event at a second time;

determining a time difference between the first time and the second time; and generating a network topology for controlling the power distribution network that indicates that:
- a first power line is associated with the first node and the second node and transports power having a first phase of power when the time difference is zero; or
- the first node and the second node are associated with different power lines having different phases of power when the time difference is non-zero.

12. The non-transitory computer-readable medium of claim 11, wherein the first node is coupled to a first element that is coupled to a first power line that transports power with the first phase of power, wherein the first phase of power reflects a phase of voltage associated with the power or a phase of current associated with the power.

13. The non-transitory computer-readable medium of claim 12, wherein the time difference is equal to zero, the first element and a second element coupled to the second node both consume power having the first phase of power, and the first element and the second element both are coupled to the first power line.

14. The non-transitory computer-readable medium of claim 12, wherein the time difference is not equal to zero, a second element coupled to the second node consumes power having a second phase of power, and the second element is coupled to a second power line.

15. The non-transitory computer-readable medium of claim 14, wherein the time difference has a negative value, indicating that the second phase of power lags the first phase of power.

16. The non-transitory computer-readable medium of claim 14, wherein the first time difference has a positive value, indicating that the second phase of power leads the first phase of power.

17. The non-transitory computer-readable medium of claim 11, wherein the first event comprises a first zero crossing associated with an alternating current or an alternating voltage monitored by the first node and drawn by a first element coupled to the first node.

18. The non-transitory computer-readable medium of claim 17, wherein the first element comprises a first single-phase power consumer, and wherein the first zero crossing occurs when the alternating current or the alternating voltage drawn by the first single-phase power consumer crosses from a positive value to a negative value.

19. The non-transitory computer-readable medium of claim 11, wherein the second event comprises a second zero crossing associated with an alternating current or an alternating voltage monitored by the second node and drawn by a second element coupled to the second node.

20. The non-transitory computer-readable medium of claim 19, wherein the second element comprises a second single-phase power consumer, and wherein the second zero crossing occurs when the alternating current or the alternating voltage drawn by the second single-phase power consumer crosses from a positive value to a negative value.

21. The non-transitory computer-readable medium of claim 11, wherein the power distribution network comprises a three-phase power distribution network.

22. A system for determining a network topology associated with a power distribution network, comprising:
- a mesh network; and
- a server machine coupled to the mesh network, wherein the server machine configures the mesh network to:
  - obtain first data indicating that a first node within the mesh network identified a first event at a first time,
  - obtain second data indicating that a second node within the mesh network identified a second event at a second time,
  - determine a time difference between the first time and the second time;
  - determine that the first node is coupled to a first element in the power distribution network that consumes power having a first phase of power, and
  - determine a phase of power associated with a second element in the power distribution network to which the second node is coupled based on the first phase of power and the time difference,
- wherein the server machine is configured to generate a network topology for controlling the power distribution network that indicates that a power line is coupled to the second element and transports power having the phase of power associated with the second element.

23. The system of claim 22, wherein the mesh network includes a plurality of nodes that are coupled to one another and exchange data with one another, and wherein each node in the plurality of nodes is associated with one or more elements included in the power distribution network.

24. The system of claim 23, further comprising a stream network that includes a plurality of data streams, wherein:
- different nodes in the mesh network execute stream functions to generate the data streams,
- each data stream comprises a time series of data values,
- the plurality of nodes included in the mesh network includes a first node and a second node that are configured to participate in the stream network, and
- the second node is configured to:
  - obtain the first data,
  - obtain the second data,
  - determine the time difference,
  - determine that the first node is coupled to the first element in the power distribution network, and
  - determine the phase of power associated with the second element.

25. The computer-implemented method of claim 1, further comprising controlling the power distribution network by causing at least one of the first element and the second element to migrate between power lines included in the power distribution network based on the network topology.

* * * * *